United States Patent [19]

Camplan et al.

[11] 4,207,489

[45] Jun. 10, 1980

[54] MOVABLE EXTRACTION ELECTRODE FOR AN ION SOURCE

[75] Inventors: Jean Camplan, Paris; Jacques Chaumont, Fontenay le Fleury; Robert Meunier, Bonnelles, all of France

[73] Assignee: Agence Nationale de Valorisation de la Recherche (ANVAR), Neuilly-sur-Seine, France

[21] Appl. No.: 964,294

[22] Filed: Nov. 28, 1978

[30] Foreign Application Priority Data

Nov. 28, 1977 [FR] France .................. 77 35758

[51] Int. Cl.² .................. H01J 1/94; H01J 27/00; H05H 1/00
[52] U.S. Cl. .................. 313/363; 250/423 R; 313/146
[58] Field of Search .................. 313/363, 146, 148, 230; 250/423

[56] References Cited

U.S. PATENT DOCUMENTS

| 2,292,087 | 8/1942 | Ramo | 313/148 X |
| 3,187,179 | 6/1965 | Craig et al. | 250/423 R X |
| 3,660,715 | 5/1972 | Post | 313/363 X |

FOREIGN PATENT DOCUMENTS 1217504  5/1966  Fed. Rep. of Germany .......... 313/146

Primary Examiner—Palmer C. Demeo
Attorney, Agent, or Firm—Frishauf, Holtz, Goodman & Woodward

[57] ABSTRACT

The extraction electrode consists of a metallic screen provided with an opening and placed within a vacuum chamber in front of an ion source, the screen being brought to a negative potential with respect to the source. Displacement of the electrode is controlled from the exterior of the chamber by two mechanical systems for independent displacement of the two lateral sides of the screen. Each system comprises a deformable parallelogram pivotally coupled to a member for supporting one side of the screen and to a member which is slidably mounted on a guide column, and a mechanism for controlling the deformation of the parallelogram by means of a link-arm rigidly fixed at one end to a toothed wheel in mesh with an endless screw and control rod which is accessible from the exterior of the chamber. The invention is primarily applicable to the construction of ion implanters, especially for the fabrication of semiconductors.

3 Claims, 3 Drawing Figures

MOVABLE EXTRACTION ELECTRODE FOR AN ION SOURCE

This invention relates to a movable extraction electrode for an ion source and finds an application in the construction of ion implanters which are primarily intended for the fabrication of semiconductors.

It is known that, in ion implanters and isotope separators, and extraction electrode is placed in front of the ion source in order to control the shape and direction of the ion beam. This electrode is constituted by a screen pierced by an opening, the screen being brought to a negative potential with respect to the source.

The shape of the ion beam is largely defined by the potential difference and the distance between the electrode screen and the ion source. In fact, if the extraction electrode is very close to the exit slit of the ion source or if its bias voltage is of very high value, the electrode has the effect of thrusting-back the plasma boundary within the ionization chamber which accordingly has a meniscus of concave shape in the vicinity of the exit slit. Under these conditions, the ions which pass out of the source are distributed within a convergent beam which proves unsatisfactory in the majority of cases.

If the extraction electrode is placed at a distance from the source or if its bias voltage is of low value, the plasma boundary is no longer thrust back within the ionization chamber and the plasma has a meniscus of convex shape in the vicinity of the exit slit. The ions emitted by the source are in this case distributed in a divergent beam which usually corresponds to the desired shape.

In principle, the characteristics of the ion beam emitted by an ion source associated with an extraction electrode do not depend solely on the bias voltage of the electrode and on the distance between this latter and the source. A large number of parameters are involved in this determination including in particular the density of the plasma, the mass of the ions, the width of the source, and so forth. Most of these parameters, however, are established by design. In regard to the bias voltage, the square root value of this voltage is applied, thus reducing its influence. Finally, the only sensible parameter which can be modified in practice is the distance between the extraction electrode and the ion source.

The problem that has therefore claimed attention in ion implanters consists in producing an ion source - extraction electrode pair, the relative positions of which can be controlled from the exterior of the vacuum chamber in which they are placed. This electrode should preferably be capable of undergoing translational motion in a direction at right angles to its plane and orientation about at least one axis contained in its plane.

In order to solve the problem, however, two types of difficulty are encountered. Firstly, the electrode actuating means are placed in a vacuum and secondly, they are placed near a heat source (the ion source). These means are therefore inevitably subjected to deformations and stresses which are liable to cause jamming of the actuating mechanism. From this it follows in particular that systems of the slideway type for producing translational motion are not at all suited to this application since they are liable to result in unduly frequent jamming and seizure.

The percise aim of the invention is to provide an extraction electrode which is not attended by the above-mentioned disadvantages since friction forces are practically zero in the hot portions of the apparatus and are limited to the relatively cold portions and since provision is also made for a minimum number of moving parts placed in a vacuum.

In more exact terms, the invention is directed to a movable extraction electrode for an ion source of the type consisting of a metallic screen pierced by an opening and placed within a vacuum chamber in front of an ion source, the screen being brought to a negative potential with respect to said source. A distinctive feature of the invention consists in providing mechanical means for controlling the displacement of the electrode from the exterior of the chamber, said means being constituted by two systems for displacing the two lateral sides of the screen independently and each system being in turn constituted by:

a deformable parallelogram having two parallel arms pivotally attached at one end to a member for supporting one side of the screen and at the other end to a member which is slidably mounted on a guide column, said column being parallel to said side;

means for controlling the deformation of said parallelogram and comprising: a link-arm pivotally mounted at one end on one of the arms and mounted at the other end on a toothed wheel disposed in meshing engagement with an endless screw coupled to a rod which passes through said chamber.

Preferably, the assembly consisting of link-arm, toothed wheel and endless screw is mounted on a carriage which is capable of sliding on the guide column, a third displacement system which is accessible from the exterior being provided for controlling the displacement of said carriage on the guide column.

The distinctive features and advantages of the invention will in any case become more readily apparent from the following description of exemplified embodiments which are given by way of explanation and not in any limiting sense, reference being made to the accompanying drawings, wherein.

Figure 1:
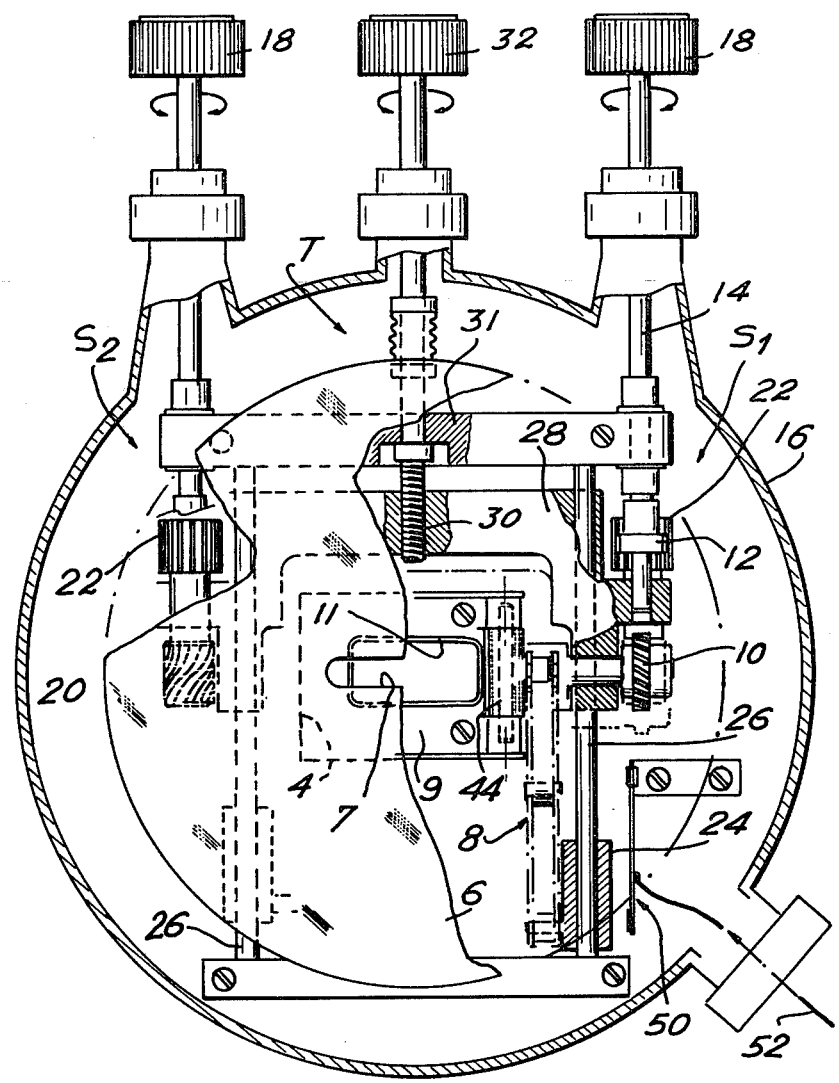
FIG. 1 is a front view of the means in accordance with the invention and illustrates the two systems for displacing the lateral sides and the system for displacing the carriage in translational motion.

In order to determine the directions of displacement of the different elements, reference will be made in the following description to a trirectangular trihedron oxyz, the screen being disposed in a plane which is parallel to yoz. Each figure corresponds to a view along one of the three axes of this trihedron: FIG. 1 corresponds to the axis ox, FIG. 2 corresponds to the axis oz and FIG. 3 corresponds to the axis oy.

The means shown in FIG. 1 comprise on the one hand two lateral displacement systems $S_1$ and $S_2$ and a central translational motion system. The systems $S_1$ and $S_2$ are applied at points 2 and 4 of a screen 6 pierced by an opening 7, the principal axis of which is parallel to oz. Behind said screen is fixed a mounting-plate 9 in which is pierced an opening 11.

In order to simplify the figure, the right-hand portion essentially shows only the means which are located at the top portion of the assembly, namely a deformable parallelogram 8 looking on the side, a toothed wheel 10, a pinion 12 connected to an actuating rod 14 which is accessible from the exterior of the chamber 16 and terminates in a control knob. There are essentially shown on the left-hand side of the figure only those elements which are located in the lower portion of the assembly, namely an endless screw 20 (disposed in meshing engagement with the toothed wheel 10), a pinion 22 (disposed in meshing engagement with the pinion 12). These components will be shown in greater detail in FIG. 2.

FIG. 1 also shows how the parallelogram system 8 is coupled to a member 24, this member being slidably mounted on a guide column 26 on which is also slidably mounted a carriage 28 for supporting the toothed wheel 10 and the pinion 22. The movement of said carriage can be effected by the central system T by producing action on the screw 30 which is coupled to a rod 31; this latter is accessible from the exterior of the chamber 16 and terminates in a control knob 32. The means which appear on the right-hand side of the figure are shown in a slightly lower position than the means shown on the left-hand side in order to provide a clear and accurate illustration of the movement of displacement of said carriage.

Figure 2:
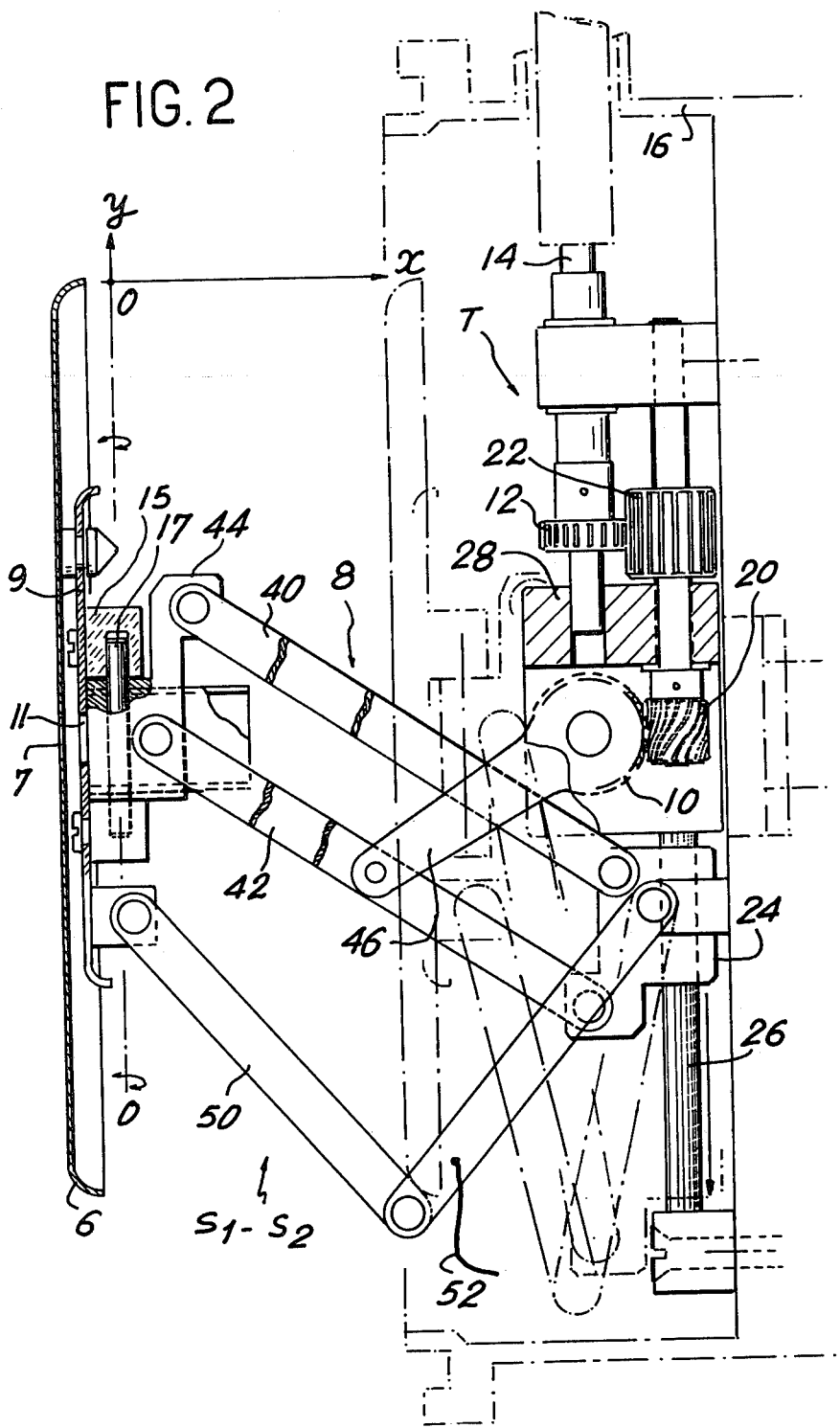
FIG. 2 is a side view illustrating a constructional detail of one of the two deformable parallelogram systems.

The system $S_1$ and especially the essential means constituting the deformable parallelogram are shown in the side view of FIG. 2. These means comprise two parallel arms 40 and 42 which are pivotally mounted on a member 44, said member 44 being coupled to the screen 6 and to the member 24 which has already been mentioned and which is slidably mounted on the guide column 26. The member 44 is coupled to a member 15 by means of pivot-pins 17. The member 15 is intended to support the mounting-plate 9. One end of a link-arm 46 is connected to the arm 42 and the other end of said link-arm is rigidly fixed to the toothed wheel 10 which has already been mentioned. Said toothed wheel can be driven in rotation by means of the endless screw 20, said endless screw being rigidly fixed to the pinion 22 and this latter being disposed in meshing engagement with the pinion 12 which is keyed on the actuating rod 14.

The mounting-plate 9 which is rigidly fixed to the member 15 has a double function: it serves to reduce the voltage required for setting-up the potential barrier for retaining the ions of the beam and to protect the mechanism against vapor which is produced by the source and which eventually has a gumming-up effect.

When the operator produces action on the rod 14, the elements mentioned above cause deformation of the parallelogram, which has the effect of moving the electrode either forwards or backwards, namely in the direction ox. The chain-dotted line shows the end position of the members when the parallelogram is completely folded-back, in which case it occupies a withdrawn position.

In addition, there is shown in FIG. 2 an articulated arm 50 for establishing the electrical connection between the electrode 6 and a voltage supply lead 52.

FIG. 2 also shows how transmission of motion to the link-arm 46 can be effected by the rod 14 in spite of its possible displacement with respect to said rod. This is made possible by virtue of the set of pinions 22 and 12, the pinion 22 being secured to the carriage 28 and the pinion 12 being rigidly fixed to the rod 14. When the carriage 28 slides along the guide column 26, the pinion 22 continues to mesh with the pinion 12 since its length is intended to be at least equal to the desired amplitude of translational motion.

Figure 3:
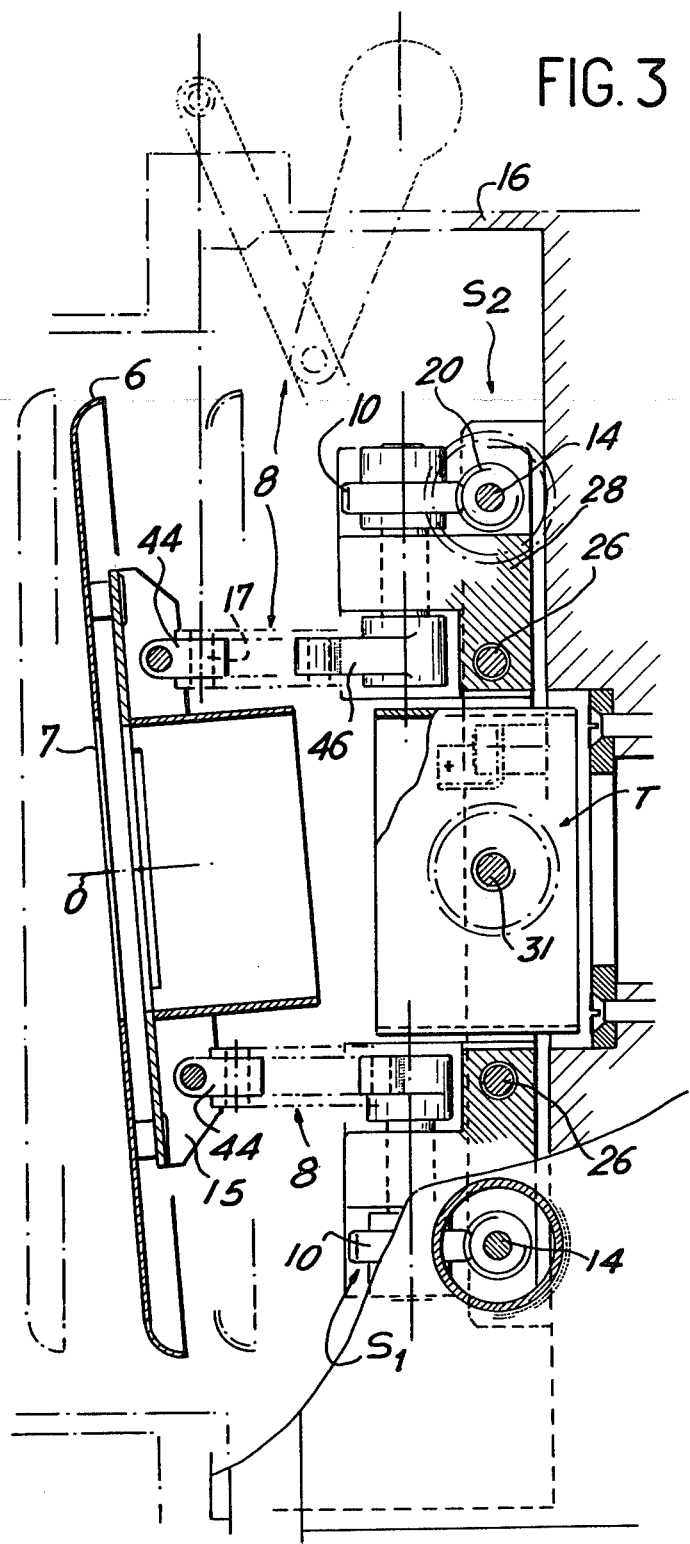
FIG. 3 is a top view illustrating the pivotal motion of the electrode.

FIG. 3 which is a top view of the means in accordance with the invention illustrates the pivotal movement of the screen about the axis oy which is obtained when the two systems $S_1$ and $S_2$ are controlled in different manner. This pivotal movement takes place by means of the pivot-pins 17. In the position shown in the figure, the parallelogram of the system $S_1$ is folded-back to a greater extent than the parallelogram of the system $S_2$. Further elements which have already been illustrated in the previous figure are again shown in this figure and for this reason bear the same references.

It will be noted that, in the mechanism which has just been described, the female portion of the components is more closely associated with the heat source and is therefore always at a higher temperature than the male portion, with the result that seizure or jamming of the mechanism is not liable to take place as a result of overheating of these components.

What we claim is:

1. A movable extraction electrode for an ion source, of the type consisting of a metallic screen pierced by an opening and placed within a vacuum chamber in front of an ion source, said screen being brought to a negative potential with respect to said source, wherein said electrode is provided with mechanical means for controlling the displacement of the electrode from the exterior of the chamber, said means being constituted by two systems for displacing the two lateral sides of the screen independently and each system aforesaid being constituted by:

a deformable parallelogram having two parallel arms pivotally attached at one end to a member for supporting one side of the screen and at the other end to a member which is slidably mounted on a guide column, said column being parallel to said side;

means for controlling the deformation of said parallelogram and comprising: a link-arm pivotally mounted at one end on one of the arms and mounted at the other end on a toothed wheel disposed in meshing engagement with an endless screw coupled to a rod which passes through said chamber.

2. An electrode according to claim 1, wherein the assembly consisting of link-arm, toothed wheel and endless screw is mounted on a carriage which is capable of sliding on the guide column, a third displacement system which is accessible from the exterior being provided for controlling the displacement of the carriage on the guide column.

3. An electrode according to claim 2, wherein the endless screw is rigidly fixed to a pinion disposed in meshing engagement with another pinion which is coupled to the control rod.

* * * * *